United States Patent
Kim et al.

(10) Patent No.: US 12,183,268 B2
(45) Date of Patent: Dec. 31, 2024

(54) DISPLAY DEVICE

(71) Applicant: LG Display Co., Ltd., Seoul (KR)

(72) Inventors: Taehun Kim, Seoul (KR); Wookyu Sang, Paju-si (KR); Moonsoo Chung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/368,371

(22) Filed: Sep. 14, 2023

(65) Prior Publication Data

US 2024/0135867 A1  Apr. 25, 2024
US 2024/0233621 A9  Jul. 11, 2024

(30) Foreign Application Priority Data

Oct. 20, 2022  (KR) .......................... 10-2022-0135371

(51) Int. Cl.
| | |
|---|---|
| G09G 3/32 | (2016.01) |
| G09G 3/20 | (2006.01) |
| G09G 3/3233 | (2016.01) |
| G09G 3/3258 | (2016.01) |
| G09G 3/3266 | (2016.01) |
| H01L 25/075 | (2006.01) |
| H01L 33/36 | (2010.01) |

(52) U.S. Cl.
CPC ....... *G09G 3/32* (2013.01); *G09G 2310/0267* (2013.01); *G09G 2320/0233* (2013.01); *G09G 2320/0252* (2013.01)

(58) Field of Classification Search
USPC ......................................................... 345/55
See application file for complete search history.

(56) References Cited

U.S. PATENT DOCUMENTS

| | | | |
|---|---|---|---|
| 2010/0220040 A1* | 9/2010 | Kwak | G09G 3/3233 345/76 |
| 2014/0198085 A1* | 7/2014 | Park | G09G 3/3241 345/212 |
| 2016/0321990 A1* | 11/2016 | Kim | G09G 3/3233 |
| 2018/0308918 A1* | 10/2018 | Choi | G09G 3/3233 |
| 2020/0211468 A1 | 7/2020 | Cho et al. | |
| 2021/0090494 A1* | 3/2021 | Hwang | G09G 3/3291 |
| 2021/0343234 A1* | 11/2021 | Yoon | G09G 3/3225 |
| 2023/0116094 A1* | 4/2023 | Kim | G09G 3/3233 345/55 |
| 2024/0005867 A1* | 1/2024 | Lee | G09G 3/3233 |

* cited by examiner

*Primary Examiner* — Chineyere D Wills-Burns
(74) *Attorney, Agent, or Firm* — Birch, Stewart, Kolasch & Birch, LLP

(57) ABSTRACT

A display device can include a light emitting element and a pixel circuit including a driving transistor; a first capacitor connected between the driving transistor and a first node; a first transistor connected between the first capacitor and a data line to operate based on a first scan signal; a first light emission transistor connected between the first capacitor and a reference voltage line to operate based on a light emission signal; and a second light emission transistor connected between the driving transistor and a low-potential voltage line to operate based on the light emission signal. The first scan signal sequentially includes a dummy scan signal section and driving scan signal section for turning on the first transistor, and the light emission signal includes a coupling period for turning on the first and second light emission transistors between the dummy scan signal section and the driving scan signal section.

27 Claims, 8 Drawing Sheets

DISPLAY DEVICE

CROSS-REFERENCE TO RELATED APPLICATION

This application claims priority to Korean Patent Application No. 10-2022-0135371, filed in the Republic of Korea, on Oct. 20, 2022, the entirety of which is hereby incorporated by reference into the present application for all purposes as if fully set forth herein.

BACKGROUND

Field

The disclosure relates to a display device, and more particularly, to a display device for enhancing response speed when switching screens.

Description of Related Art

Display devices used in computer monitors, TVs, and cell phones include organic light emitting displays (OLEDs), which are self-emissive (e.g., no backlight unit), and liquid crystal displays (LCDs), which require a separate light source.

Display devices are increasingly being applied not only to computer monitors and televisions, but also to personal mobile devices, and research is underway to develop display devices with large display areas and reduced volume and weight.

Further, in recent years, display devices that include light emitting diodes (LEDs) have been drawing attention as the next-generation display devices. Because LEDs are made of inorganic materials rather than organic materials, they are more reliable and have a longer lifespan than liquid crystal displays or organic light-emitting diodes. Not only are LEDs fast to light up, but LEDs are also have high luminous efficiency and are shock-resistant, reliable, and capable of displaying high-brightness images.

However, when switching or transitioning from displaying a dark scene (e.g., a black or dark image) to displaying a bright scene (e.g., a white or bright image), the display device can a luminance drop can occur and linger for a few frames, which can become noticeable to a viewer and impair image quality. Thus, there exists a need for a display device that can have faster response speed and improved image quality, even during drastic scene transitions, and can prevent or suppress noise and ghost defects.

SUMMARY OF THE DISCLOSURE

The disclosure aims to provide a display device capable of preventing luminance reduction, ghost images, or image noise by enhancing the response speed when switching screens.

The disclosure also aims to provide a display device capable of representing accurate grayscales through precise data voltage charging.

Objects of the disclosure are not limited to the foregoing, and other unmentioned objects would be apparent to one of ordinary skill in the art from the following description.

To achieve the foregoing objectives, a display device according to an embodiment of the disclosure comprises a light emitting element and a pixel circuit providing a driving current to the light emitting element. The pixel circuit includes a driving transistor having a gate electrode, a source electrode, and a drain electrode, a first capacitor having a first electrode connected with the gate electrode and a second electrode connected with a first node, a first transistor connected between the second electrode and a data line and controlled by a first scan signal, a first light emission transistor connected between the second electrode and a reference voltage line and controlled by a light emission signal, and a second light emission transistor connected between the drain electrode and a low-potential voltage line and controlled by the light emission signal.

In the display device according to an embodiment of the disclosure, the first scan signal includes a first dummy scan signal section having a first voltage level for turning on the first transistor and a first driving scan signal section. A signal section between the first dummy scan signal section and the first driving scan signal section has a second voltage level different from the first voltage level.

In the display device according to an embodiment of the disclosure, the light emission signal includes a dummy light emission signal section for turning on the first light emission transistor and the second light emission transistor between the first dummy scan signal section and the first driving scan signal section. Accordingly, the display device can mitigate luminance reduction and enhance response speed during screen switch.

To achieve the foregoing objectives, a display device according to another embodiment of the disclosure comprises a substrate including a plurality of subpixels, a scan line and a light emission line disposed in a row direction on the substrate, scan transistors connected with the scan line on the substrate, light emission transistors connected with the light emission line on the substrate, a driving transistor disposed on the same plane as the scan transistors and the light emission transistors, and a light emitting element disposed in any one area on the scan transistors, the light emission transistors, and the driving transistors. In this situation, a scan signal applied to a first scan line includes a dummy scan signal section, and a light emission signal applied to the light emission line includes a dummy light emission signal section for turning on the light emission transistors after the dummy scan signal section. Accordingly, the display device can mitigate luminance reduction and enhance response speed during screen switch.

Specific details of other embodiments are included in the detailed description and drawings.

According to embodiments of the disclosure, it is possible to enhance the response speed by including a dummy scan signal section in the scan signal provided to the pixel circuit.

According to embodiments of the disclosure, it is possible to, although the data voltage is changed, represent an accurate grayscale by applying the changed data voltage by providing the light emission signal of the turn-on voltage before sampling normal data to the pixel circuit.

The effects of an embodiment are not limited by the foregoing, and other various effects are included in the disclosure.

BRIEF DESCRIPTION OF THE DRAWINGS

The above and other objects, features, and advantages of the disclosure will be more clearly understood from the following detailed description, taken in conjunction with the accompanying drawings, in which.

DETAILED DESCRIPTION OF THE EMBODIMENTS

Figure 1:
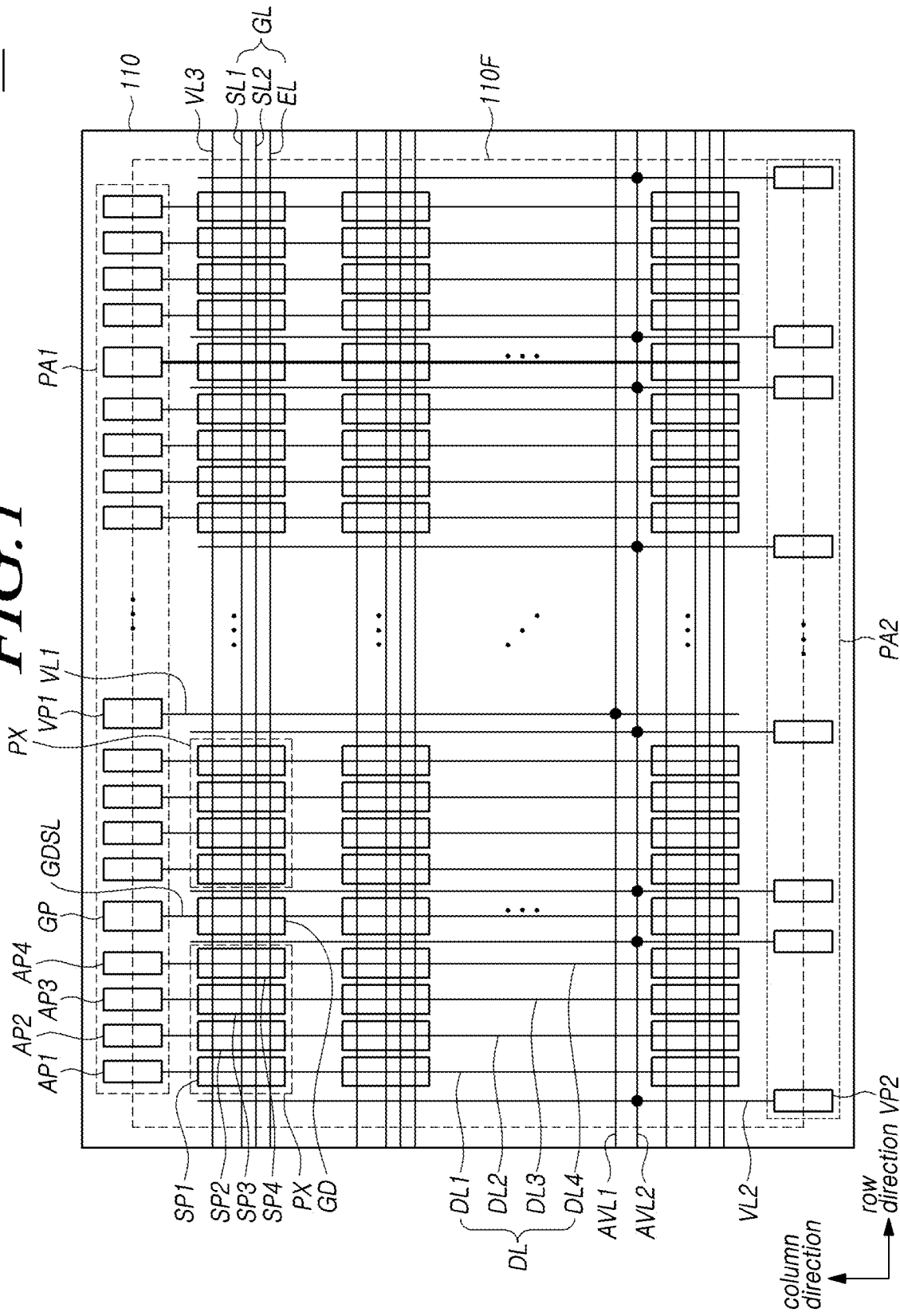
FIG. 1 is a plan view schematically illustrating a display device according to an embodiment of the disclosure.

Advantages and features of the disclosure, and methods for achieving the same can be understood through the embodiments to be described below taken in conjunction with the accompanying drawings. However, the disclosure is not limited to the embodiments disclosed herein, and various changes can be made thereto. The embodiments disclosed herein are provided only to inform one of ordinary skilled in the art of the category of the disclosure. The disclosure is defined only by the appended claims.

The shapes, areas, proportions, angles, and numbers disclosed in the drawings to illustrate embodiments of the disclosure are exemplary and are not intended to limit the disclosure to those shown. The same reference numeral denotes the same element throughout the specification. When determined to make the subject matter of the disclosure unclear, the detailed description of the known art or functions can be skipped. As used herein, when a component "includes," "has," or "is composed of" another component, the component can add other components unless the component "only" includes, has, or is composed of" the other component. As used herein, the singular forms "a," "an," and "the" are intended to include the plural forms as well, unless the context clearly indicates otherwise.

Components are interpreted to include a margin of error, even if not explicitly stated otherwise.

If the description is of a positional relationship, for example, "on," "above," "under," "below," "next to," etc. of two parts, one or more other parts can be located between the two parts, unless "directly" is used.

When an element or layer is referred to as being "on" another element or layer, any layer or other element can be positioned directly on the other element or intervene therebetween.

Although the terms "first" and "second" are used to describe various components, the components are not limited by the terms. These terms are provided simply to distinguish one component from another. Accordingly, the first component mentioned herein can also be the second component within the technical spirit of the disclosure.

The same reference numeral denotes the same element throughout the specification.

The area and thickness of each configuration shown in the drawings are shown for illustrative purposes only, and the disclosure is not necessarily limited to the area and thickness of the configurations shown.

The feature of various embodiments of the disclosure can be partially or wholly combined or coupled with each other, and various technical interlockings and operations are possible, and the embodiments can be practiced independently of each other or in conjunction with each other.

Hereinafter, various embodiments of the disclosure are described in detail with reference to the accompanying drawings.

FIG. 1 is a plan view schematically illustrating a display device according to an embodiment of the disclosure. Particularly, FIG. 1 illustrates only a substrate 110, a plurality of pixels PX, pads, and various lines among the various components of a display device 100 for ease of description.

The substrate 110 is a component for supporting the various components included in the display device 100, and can be formed of an insulating material. For example, the substrate 110 can be formed of, e.g., glass or resin. Further, the substrate 110 can comprise a polymer or plastic, or can be made of a material having flexibility.

The substrate 110 can be divided into a display area and a non-display area. The display area is the area where a plurality of pixels PX are arranged to display the image. The plurality of pixels PX can include at least two subpixels. In the drawings, the plurality of pixels PX include, but are not limited to, four subpixels SP1, SP2, SP3, and SP4. The four subpixels include a first subpixel SP1, a second subpixel SP2, a third subpixel SP3, and a fourth subpixel SP4. Hereinafter, one subpixel among the four subpixels is also referred to as SP.

Each of the plurality of subpixels SP is an individual unit that emits light, and a light emitting element 120 and a pixel circuit are disposed in each of the plurality of subpixels SP. The pixel PX including four subpixels SP1, SP2, SP3, and SP4 can include a red subpixel, a green subpixel, a blue subpixel, and a white subpixel, or can include a red subpixel, a green subpixel, a blue subpixel, and a subpixel emitting light in any one of red, green, and blue, but is not limited thereto. The pixel PX can include at least two subpixels including a light emitting element having the lowest efficiency among the red light emitting element, the green light emitting element, and the blue light emitting element.

The display device 100 according to an embodiment of the disclosure can include a first subpixel SP1 emitting red light, a second subpixel SP2 emitting red light, a third subpixel SP3 emitting green light, and a fourth subpixel SP4 emitting blue light, and the first subpixel SP1, second subpixel SP2, third subpixel SP3, and fourth subpixel SP4 can be disposed side by side in a row direction.

As mentioned above, the display area is an area where the plurality of pixels PX are disposed, and the non-display area is an area where the image is not displayed, e.g., an area where the plurality of pixels PX are not disposed, and an area where the gate driver GD for the plurality of subpixels SP, various lines, and pads for applying signals to the lines are disposed.

The gate driver GD supplies gate signals to the plurality of pixels PX through the gate lines GL. The gate signals include a first scan signal, a second scan signal, and a light emission signal. The first scan signal is provided through the first scan line SL1, the second scan signal is provided through the second scan line SL2, and the light emission signal is provided through the light emission line EL. The first scan line SL1, the second scan line SL2, and the light emission line EL can be collectively referred to as the gate line GL. Thus, the gate driver GD includes a first scan driver providing the first scan signal, a second scan driver providing the second scan signal, and a light emitting driver providing the light emission signal.

In the display device 100 according to an embodiment of the disclosure, the gate driver GD can be separated into a plurality of areas on the substrate 110 and disposed between the plurality of pixels PX.

In the display device 100 according to an embodiment of the disclosure, the light emitting element can be a light emitting diode (LED). Since the LED has excellent luminous efficiency, the area occupied by the LED relative to the pixel PX can be very small. Accordingly, the gate driver GD, as well as the LED and the pixel circuit driving the LED, can be disposed in one pixel PX.

The gate driver GD can be disposed every two pixels PX (e.g., between adjacent pairs of pixels) to provide a gate signal to the pixels PX disposed in the same row as the gate driver GD. For example, the gate driver GD can be disposed between the blue light emitting subpixel and the red light emitting subpixel. However, without limitations thereto, the arrangement density of the gate driver GD can be changed in some situations.

The first scan driver, the second scan driver, and the light emitting driver included in the gate driver GD can be disposed in the same row, but in different areas.

The data driver converts image data into data signals and supplies the converted data signals to the pixels PX through the data lines DL. The data driver can be formed on the rear surface of the substrate 110 or can be formed on a separate substrate. When the data driver is formed on one surface of a separate substrate, the other surface where the data driver is not formed can face, and be bonded to, the rear surface of the substrate 110. To electrically connect the front and rear surfaces of the substrate 100 or electrically connect the front surface of the substrate 100 and the other surface of the separate substrate, a side line is disposed on a side surface of the substrate 100 or the substrate separate from the substrate 100. Accordingly, the data driver disposed on the rear surface of the substrate 100 or the other surface of the separate substrate can supply data signals to the pixels PX through the sideline.

As described above, in the display device 100 according to an embodiment of the disclosure, the gate driver GD can be disposed between adjacent pixels PX on the substrate 110. However, without limitations thereto, the gate driver GD can be disposed on one side or each of two opposite sides of the substrate 110.

Meanwhile, on the substrate 110, the gate lines GL can be disposed in a row direction, and the data lines DL can be disposed in a column direction. The gate lines GL and the data lines DL are disposed in all the subpixels SP to provide signals to the pixel circuits disposed in the subpixels SP.

Pad areas PA1 and PA2 in which pads are disposed are formed on two opposite sides of the substrate 110, that is, upper and lower portions of the substrate 110 in the column direction. In this situation, the pad area formed in an upper portion of the substrate 110 is referred to as a first pad area PA1, and the pad area formed in a lower portion of the substrate 110 is referred to as a second pad area PA2. In the substrate 110, the first pad area PA1 and the second pad area PA2 face each other.

In the first pad area PA1, data pads AP1, AP2, AP3, and AP4 connected with data lines DL, gate pads GP connected with the gate driver GD, a high-potential voltage pad VP1 connected with the high-potential voltage line VL1, and a reference voltage pad connected with the reference voltage line VL3 can be disposed. In this situation, the data pads are disposed as many as the number of subpixels SP included in the pixel PX. The data pads can include a first data pad AP1 connected to the first data line DL1, a second data pad AP2 connected to the second data line DL2, a third data pad AP3 connected to the third data line DL3, and a fourth data pad AP4 connected to the fourth data line DL4.

Lines for providing various clock signals, a line for providing the gate low voltage, and a line for providing the gate high voltage can be disposed in the gate driver GD to transfer signals. The gate drivers GD are disposed side by side in the column direction so that various signal transfer lines are aligned with the gate drivers GD. The lines for transferring signals to the gate drivers GD are referred to as gate driver lines GDSL, and the gate driver lines GDSL are disposed in the column direction and connected to the gate pads GP disposed in the first pad area PA1 to receive signals from the gate pads GP.

The high-potential voltage line VL1 can be disposed at every pixel PX or every subpixel SP in the column direction. In the drawings, it is illustrated that the high-potential voltage line VL1 is disposed every two pixels PX, but is not limited thereto. The high-potential voltage lines VL1 disposed in the column direction provide the high-potential voltage to the plurality of subpixels SP through the high-potential voltage pads VP1 in the first pad area PAL. The plurality of high-potential voltage lines VL1 disposed in the column direction are connected to auxiliary high-potential voltage lines AVL1 disposed in the row direction to form a mesh structure. The auxiliary high-potential voltage line AVL1 can be disposed at every row in which the pixels PX are disposed or every multiple rows. The auxiliary high-potential voltage line AVL1 can prevent the voltage drop of the high-potential voltage line VL1 and provide the high-potential voltage to the plurality of subpixels SP.

The low-potential voltage pads VP2 connected to the low-potential voltage lines VL2 can be disposed in the second pad area PA2.

Al least one low-potential voltage line VL2 can be disposed at every pixel PX or every subpixel SP in the column direction. In the drawings, it is illustrated that two low-potential voltage lines VL2 are disposed every two pixels PX, but is not limited thereto. The low-potential voltage lines VL2 disposed in the column direction provide the low-potential voltage to the plurality of subpixels SP through the low-potential voltage pads VP2 in the first pad area PA2. The plurality of low-potential voltage lines VL2 disposed in the column direction are connected to auxiliary low-potential voltage lines AVL2 disposed in the row direction to form a mesh structure. The auxiliary low-potential voltage line AVL2 can be disposed at every row in which the pixels PX are disposed or every multiple rows. The auxiliary low-potential voltage line AVL2 can prevent the voltage drop of the low-potential voltage line VL2 and provide the low-potential voltage to the plurality of subpixels SP.

The reference voltage line VL3 can be disposed at every pixel row disposed in the row direction. The reference voltage line VL3 disposed in the row direction is connected to the reference voltage pad through a separately disposed column-directed line, and the reference voltage is provided to the plurality of subpixels SP through the reference voltage pad.

In the display device according to an embodiment of the disclosure, the four side edges of the substrate 110 can be ground to reduce the size of the bezel. The bezel is an edge area of the substrate 110 where subpixels are not disposed. The size of the ground substrate 110 is reduced so that a display device can be implemented with the size of the final substrate 110F (e.g., see the dotted line).

In this situation, most of the pads disposed in the first pad area PA1 and the second pad area PA2 can be obliterated or at least partially removed, leaving only some of the pads on the final substrate 110F.

A detailed description of the plurality of subpixels SP is described below in greater detail with reference to FIG. 2.

Figure 2:
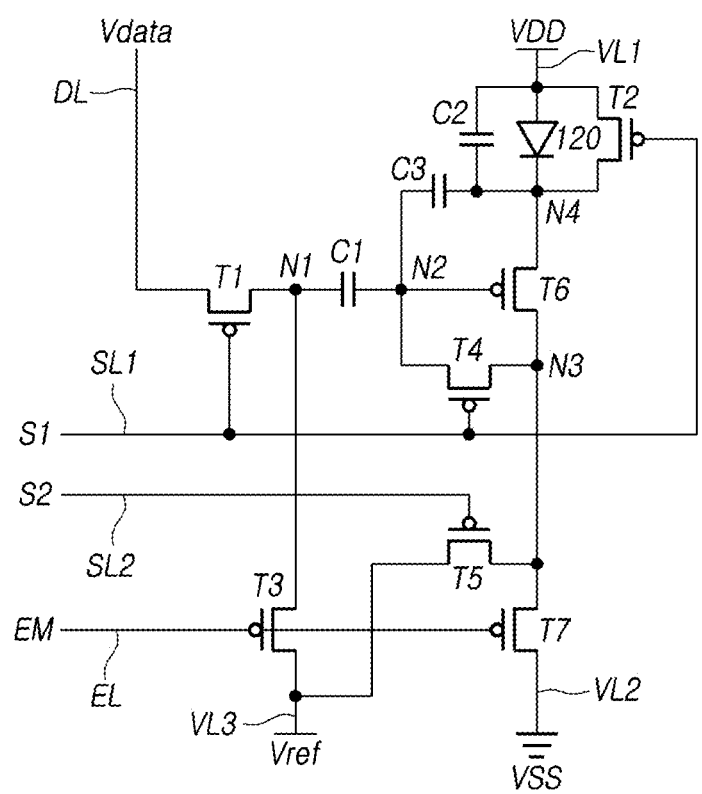
FIG. 2 is a circuit diagram illustrating a light emitting element and a pixel circuit included in a display device according to an embodiment of the disclosure.

FIG. 2 is a circuit diagram illustrating a light emitting element and a pixel circuit included in a display device according to an embodiment of the disclosure. FIG. 2 shows a light emitting element and a pixel circuit included in a subpixel SP disposed in the nth row. In this situation, n is a natural number.

Referring to FIG. 2, each of the plurality of subpixels SPs is connected with a first scan line SL1, a second scan line SL2, a data line DL, an emission line EL, a high-potential voltage line VL1, a low-potential voltage line VL2, and a reference voltage line VL3, and each of the plurality of subpixels SPs includes a pixel circuit including a first transistor T1, a second transistor T2, a third transistor T3, a fourth transistor T4, a fifth transistor T5, a sixth transistor T6, a seventh transistor T7, a first capacitor C1, a second capacitor C2, and a third capacitor C3, and a light emitting element 120 connected to the pixel circuit. In this situation, the high-potential voltage line VL1 can be referred to as a first power line, the low-potential voltage line VL2 can be referred to as a second power line, and the reference voltage line VL3 can be referred to as a third power line.

First, the first transistor T1, the second transistor T2, the third transistor T3, the fourth transistor T4, the fifth transistor T5, the sixth transistor T6, and the seventh transistor T7 of the pixel circuit are disposed in each of the plurality of subpixels SPs. Each of the first transistor T1, second transistor T2, third transistor T3, fourth transistor T4, fifth transistor T5, sixth transistor T6, and seventh transistor T7 includes a gate electrode, a source electrode, and a drain electrode.

The first transistor T1, the second transistor T2, the third transistor T3, the fourth transistor T4, the fifth transistor T5, the sixth transistor T6, and the seventh transistor T7 can be N-type transistors or P-type transistors. Since electrons are carriers in the N-type transistor, electrons can flow from the source electrode to the drain electrode, and current can flow from the drain electrode to the source electrode. Since holes are carriers in the P-type transistor, holes can flow from the source electrode to the drain electrode, and current can flow from the source electrode to the drain electrode. For example, one of the plurality of transistors can be an N-type transistor, and another one of the plurality of transistors can be a P-type transistor. For example, the pixel circuit can include a mix of N-type transistors and P-type transistors. The following description assumes that the first transistor T1, second transistor T2, third transistor T3, fourth transistor T4, fifth transistor T5, sixth transistor T6, and seventh transistor T7 are P-type transistors, but is not limited thereto.

The first transistor T1 can include a first gate electrode, a first source electrode, and a first drain electrode. The first gate electrode is connected to the first scan line SL1. The first source electrode is connected to the data line DL, and the first drain electrode is connected to the first node N1. The first transistor T1 can transfer the data voltage Vdata from the data line DL to the first node N1 based on the first scan signal S1 of the first scan line SL1.

For example, upon switching from a low-grayscale screen to a high-grayscale screen (e.g., switching from a dark image to a bright image, such as from black to white, etc.), a luminance drop can occur due to failure to rapidly applying the data voltage Vdata to the first node N1 by the first transistor T1 in the first frame. The luminance drop can occur not only in the first frame, but also in the second and third frames. In other words, a luminance drop experienced when switching from a dark scene to a bright scene can linger for a few frames, which can become noticeable to a viewer and impair image quality. Such a luminance drop can result in a ghost image and image noise and thus should be mitigated. A solution to this is described below in connection with the drawings.

The third transistor T3 can include a third gate electrode, a third source electrode, and a third drain electrode. The third gate electrode is connected to the light emission line EL. The third source electrode is connected to the reference voltage line VL3, and the third drain electrode is connected to the first node N1. The third transistor T3 can transfer the reference voltage Vref from the reference voltage line VL3 to the first node N1 according to the light emission signal EM and maintain a constant voltage at the second node N2 while the light emitting element 120 emits light. The third transistor T3 can also be referred to as a first light emission transistor.

The fourth transistor T4 includes the fourth gate electrode, the fourth source electrode, and the fourth drain electrode. The fourth gate electrode is connected to the first scan line SL1, the fourth source electrode is connected to the second node N2, and the fourth drain electrode is connected to the third node N3. The fourth transistor T4 can short or connect the sixth gate electrode and the sixth drain electrode of the sixth transistor T6 together, and the sixth transistor T6 can be diode-connected. The diode connection is to short-circuit or connect the gate and drain electrodes, causing the transistor to behave like a diode.

The fifth transistor T5 includes a fifth gate electrode, a fifth source electrode, and a fifth drain electrode. The fifth gate electrode is connected to the second scan line SL2. The fifth source electrode is connected to the reference voltage line VL3, and the fifth drain electrode is connected to the third node N3. The fifth transistor T5 can provide a reference voltage Vref to the third node N3 based on the second scan signal S2 of the second scan line SL2 and can reset the sixth drain electrode of the sixth transistor T6, which is the third node N3, to the reference voltage Vref.

The sixth transistor T6 includes a sixth gate electrode, a sixth source electrode, and a sixth drain electrode. The sixth gate electrode is connected to the second node N2. The sixth source electrode is connected to the fourth node N4, and the sixth drain electrode is connected to the third node N3. The sixth transistor T6 can be turned on to control the driving current flowing to the light emitting element 120, and can be referred to as a driving transistor.

The second transistor T2 includes a second gate electrode, a second source electrode, and a second drain electrode. The second gate electrode is connected to the first scan line SL1. The second source electrode is connected to the high-potential voltage line VL1, and the second drain electrode is connected to the fourth node N4. The second transistor T2 can transfer the high-potential power supply voltage VDD to the fourth node N4 based on the first scan signal S1 of the first scan line SL1.

The seventh transistor T7 includes a seventh gate electrode, a seventh source electrode, and a seventh drain electrode. The seventh gate electrode is connected to the light emission line EL. The seventh source electrode is connected to the third node N3, and the seventh drain electrode is connected to the low-potential voltage line VL2. The seventh transistor T7 can provide a low-potential power supply voltage to the third node N3 according to the light emission signal EM to allow the driving current to flow. The seventh transistor T7 can also be referred to as a second light emission transistor. For example, the gate electrodes of the seventh transistor T7 and the third transistor T3 are both connected to the light emission line EL to receive the light emission signal EM.

The first transistor T1, the second transistor T2, the fourth transistor T4, and the fifth transistor T5 are controlled by the first scan signal S1 or the second scan signal S2 and can be referred to as scan transistors.

The first capacitor C1 can include a capacitor electrode connected to the first node N1 and a capacitor electrode connected to the second node N2. The first capacitor C1 can fix or maintain the voltage applied to the sixth gate electrode of the sixth transistor T6 while the light emitting element 120 emits light, thereby maintaining a constant driving current.

The second capacitor C2 can include a capacitor electrode connected to the fourth node N4 and a capacitor electrode connected to the high-potential voltage line VDD. In other words, the second capacitor C2 includes capacitor electrodes connected to the cathode and anode, respectively, of the light emitting element 120. The second capacitor C2 can maintain a constant voltage of the light emitting element 120 so that the light emitting element 120 can continue to emit light while maintaining the same luminance while the same driving current flows.

The third capacitor C3 includes a capacitor electrode connected to the second node N2 and a capacitor electrode connected to the fourth node N4. For example, the third capacitor C3 is connected between the first capacitor C1 and the second capacitor C2. In other words, the third capacitor C3 is a capacitor formed between the sixth gate electrode and the sixth source electrode of the sixth transistor T6 and between the sixth gate electrode and the cathode of the light emitting element 120. Accordingly, the third capacitor C3 can maintain the gate-source voltage of the sixth transistor T6. For example, according to an embodiment, the pixel circuit includes three different capacitors (C1, C2, C3) arranged as specific locations for stabilizing three different aspects of the pixel circuit, in order to better maintain luminance without experiencing any decrease in brightness, even when executing a drastic scene change, such as switching from displaying a dark image to displaying a bright image.

Figure 3:
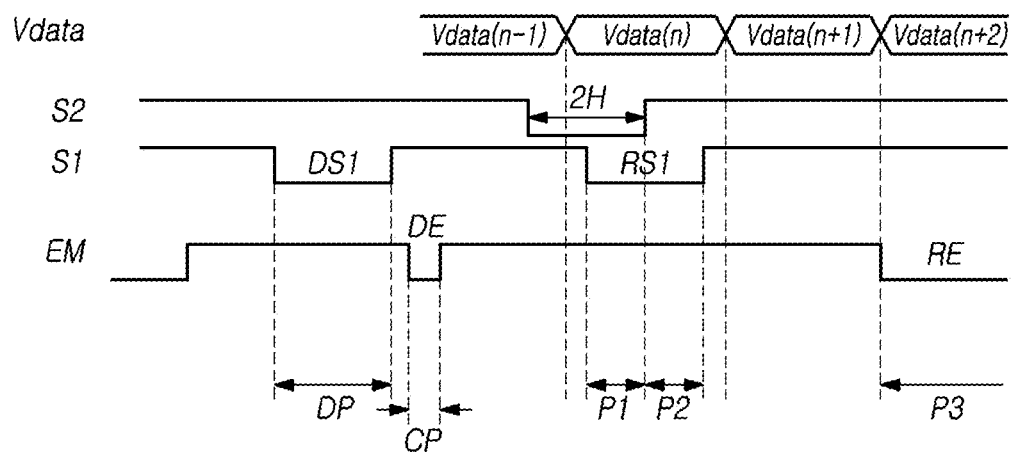
FIGS. 3 and 4 are views illustrating waveforms of gate signals according to an embodiment of the disclosure.
Figure 4:
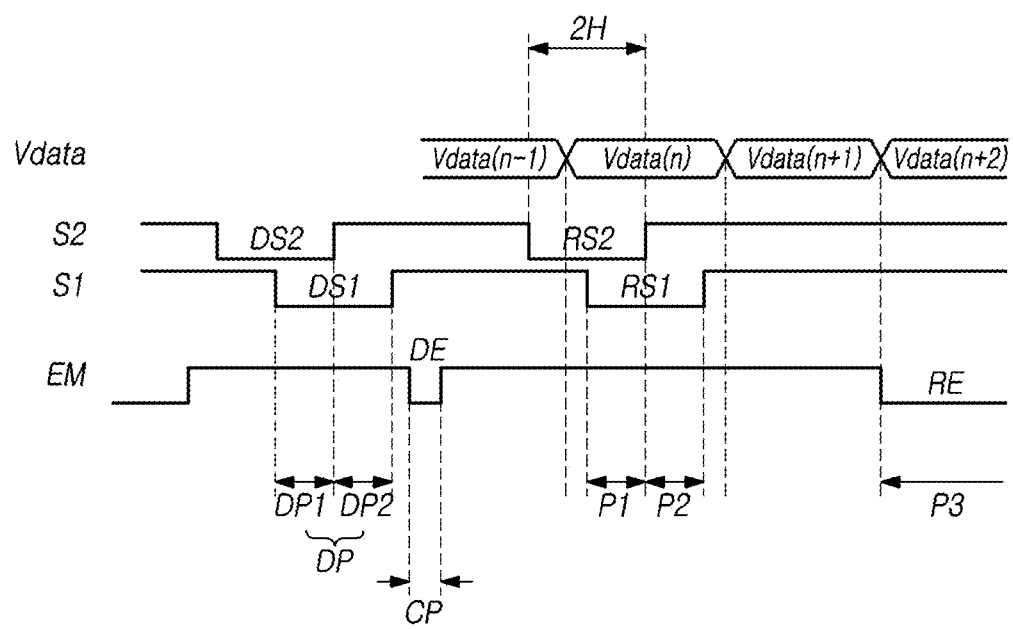

FIGS. 3 and 4 are views illustrating waveforms of gate signals according to an embodiment of the disclosure.

The driving of the pixel circuit is described with reference to FIGS. 2 and 3.

Referring to FIGS. 2 and 3, the driving of the pixel circuit can be divided into a first period P1, a second period P2, and a third period P3. The first period P1 to the third period P3 occur sequentially. To mitigate luminance reduction, ghost images, and screen noise described above, the scan signal according to an embodiment of the disclosure includes a driving scan signal section (also referred to as a "driving scan pulse"). Specifically, the first scan signal S1 can include a first dummy scan signal section DS1, and a period during which the first dummy scan signal section DS1 is provided is referred to as a dummy period DP. The dummy period DP occurs before the first period P1.

The first scan signal S1 and the second scan signal S2 each include a signal section having a first voltage level (e.g., gate low voltage) for two horizontal periods (2H), the second scan signal S2 includes a signal section having a first voltage level (e.g., gate low voltage) for at least two horizontal periods (2H), and the light emission signal EM includes a signal section having a second voltage level (e.g., gate high voltage) for at least two horizontal periods (2H).

The first scan signal S1, the second scan signal S2, and the light emission signal EM swing between the first voltage level (e.g., gate low voltage) and the second voltage level (e.g., gate high voltage). The signal section of the first voltage level (e.g., gate low voltage) of the second scan signal S2 occurs before the signal section of the first voltage level (e.g., gate low voltage) of the first scan signal S1 and can overlap by one horizontal period (1H). In the disclosure, the first voltage level can be a gate low voltage, and the second voltage level can be a gate high voltage. Alternatively, the first voltage level can be a gate high voltage, and the second voltage level can be a gate low voltage. Hereinafter, for convenience of description, it is assumed that the first voltage level is a gate low voltage, and the second voltage level is a gate high voltage.

The data voltage Vdata is provided to the subpixel SP disposed in the nth row while the first scan signal S1 is the signal section of the gate low voltage. The data voltage provided to the subpixel SP disposed in the nth row is denoted as Vdata(n). The signal section of the gate low voltage of the first scan signal S1 when Vdata(n) is applied is referred to as a first driving scan signal section RS1. The first scan signal S1 includes a first dummy scan signal section DS1 and a first driving scan signal section RS1, and the first dummy scan signal section DS1 occurs before the first driving scan signal section RS1.

As described above, the period during which the first scan signal S1 is the first dummy scan signal section DS1 is referred to as the dummy period DP. The dummy period DP can be about 2 horizontal periods (2H).

During the dummy period DP, the first transistor T1 is turned on to apply the data voltage Vdata to the first node N1, the fourth transistor T4 is turned on to electrically connect the second node N2 and the third node N3 together, and the second transistor T2 is turned on to electrically the anode and the fourth node N4 together. In the dummy period DP, the fourth node N4 becomes the high-potential voltage VDD, and the second node N2 and the third node N3 are electrically connected so that the threshold voltage Vth of the sixth transistor T6 is sampled to the second node N2. Accordingly, the dummy period DP can also be referred to as a dummy sampling period.

In the dummy period DP, the data voltage Vdata input to the first node N1 is a dummy data voltage, and can be a dummy data voltage or a data voltage input to any one of the rows before the nth row. This is described below in detail with reference to FIG. 7.

When the pixel circuit is driven, the data voltage Vdata can be previously applied to the first node N1 through the dummy period DP before the first period P1. For example, as the screen is switched from a low to high grayscale, the sampling error due to the variation in the gate-source voltage Vgs of the driving transistor can be reduced by previously applying the data voltage Vdata through the dummy period DP after the screen switch. In other words, the pixel circuit can pre-charge or pre-apply the data voltage Vdata during the dummy period DP to help prepare the pixel circuit for the display transition or switching from a dark scene to a bright scene. Accordingly, as the display device according to an embodiment of the disclosure has the dummy period DP before the first period P1, it is possible to mitigate luminance reduction and enhance the response speed of the display device by previously charging the first node N1 of the pixel circuit with the data voltage Vdata.

Meanwhile, if the first scan signal S1 is continuously and repeatedly opened to perform the first period P1 after the dummy period DP upon driving the pixel circuit, the data voltage Vdata is not applied to the second node N2 so that the corresponding condition may not be applied even though the data voltage Vdata is changed. In this situation, the signal is opened means turning on the transistors whose gate electrodes are connected to the signal lines.

Thus, the driving of the pixel circuit of the display device according to an embodiment of the disclosure includes a coupling period CP between the dummy period DP and the first period P1. In the coupling period CP, the light emission signal EM has a gate low voltage signal section. The signal section of the gate low voltage of the light emission signal EM in the coupling period CP is also referred to as a dummy light emission signal section DE (also referred to as a "dummy light emission pulse"). In a light emission period to be described below, the signal section of the gate low voltage of the light emission signal EM is referred to as a driving light emission signal section RE (also referred to as a "driving light emission pulse"). The light emission signal EM can include a dummy light emission signal section DE and a driving light emission signal section RE. The dummy light emission signal section DE occurs prior to the driving light emission signal section RE.

In the coupling period CP, the third transistor T3 and the seventh transistor T7 are turned on by the dummy light emission signal section DE of the light emission signal EM. The data voltage Vdata applied to the first node N1 in the dummy period DP is applied to the second node N2 by the turned-on third transistor T3 in the coupling period CP. The first node N1 is changed from the data voltage Vdata to the reference voltage Vref by the third transistor T3 turned on during the coupling period CP. The voltage variation of the first node N1 is applied to the second node N2 due to the coupling phenomenon of the first capacitor C1. For example, even when the data voltage is changed as the screen is switched from a low grayscale to a high grayscale (e.g., transitions from a dark scene to a bright scene), the changed data voltage can be applied to the gate electrode of the driving transistor through the coupling period CP. Since the coupling period CP actually occurs before initialization of the pixel circuit, sampling, and light emission, it can also be referred to as a dummy coupling period.

According to an embodiment of the disclosure, the driving of the pixel circuit of the display device can include a dummy period DP and a coupling period CP before the initialization period, so that the response speed delay that occurs instantaneously upon switching screens of the display device can be mitigated or prevented.

The period when both the first scan signal S1 and the second scan signal S2 are the gate low voltages is referred to as the first period P1. The first period can be one horizontal period (1H). In this situation, the gate low voltage of the first scan signal S1 is the first driving scan signal section RS1.

During the first period P1, the first transistor T1 is turned on to apply the data voltage Vdata(n) to the first node N1, and the fourth transistor T4 is turned on to electrically connect the second node N2 and the third node N3. The reference voltage Vref applied to the third node N3 by the fifth transistor T5 immediately before the first period P1 is maintained during the first period P1 as well. Accordingly, the second node N2 is also initialized to the reference voltage Vref by the turned-on fourth transistor T4. In the first period P1, the second transistor T2 is turned on to electrically connect the anode and the fourth node N4, so that the fourth node N4 is set to the high-potential voltage VDD. The first period P1 can also be referred to as an initialization period.

In the first period P1, the third transistor T3 and the seventh transistor T7 are turned off. In the first period P1, since the second node N2 is the reference voltage Vref and the fourth node N4 is the high-potential voltage VDD, the gate-source voltage Vgs of the sixth transistor T6 is the difference VDD-Vref between the high-potential voltage VDD and the reference voltage Vref. In this situation, the high-potential voltage VDD is higher than the reference voltage Vref. Further, the sixth transistor T6 can be turned on, but the light emitting element 120 does not emit light because the seventh transistor T7 is turned off.

The period when the second scan signal S2 is a gate high voltage and the first scan signal S1 is a gate low voltage is referred to as a second period P2. The second period P2 can be about one horizontal period.

In the second period P2, the fifth transistor T5 is turned off, and the first transistor T1, the second transistor T2 and the fourth transistor T4 maintain a turned-on state. In this situation, as the reference voltage Vref applied to the third node N3 is cut off, the sixth transistor T6 is diode-connected through the fourth transistor T4. Accordingly, the threshold voltage of the sixth transistor T6 is sampled at the second node N2. Accordingly, the second period P2 can be referred to as a sampling period.

In the second period P2, the third transistor T3, the fifth transistor T5, and the seventh transistor T7 remain turned off. In the second period P2, since the second node N2 is the sum of the high-potential voltage VDD and the threshold voltage Vth, and the fourth node N4 has the high-potential voltage VDD, the gate-source voltage Vgs of the sixth transistor T6 becomes the threshold voltage Vth of the sixth transistor T6. In this situation, the data voltage Vdata(n) is maintained at the first node N1. In this situation, the sixth transistor T6 can be turned on, but the light emitting element 120 does not emit light because the seventh transistor T7 is turned off.

The period when the first scan signal S1 and the second scan signal S2 are gate high voltages, and the light emission signal EM is a gate low voltage is referred to as a third period P3. In this situation, the signal section of the gate low voltage of the light emission signal EM is the driving emission signal section EM.

In the third period P3, the first transistor T1, the second transistor T2, and the fourth transistor T4 are turned off, and the third transistor T3 and the seventh transistor T7 are turned on while the fifth transistor T5 remains turned off. In this situation, as the reference voltage Vref is applied to the first node N1 through the third transistor T3, the voltage at the second node N2 is varied or changes due to the coupling of the first capacitor C1.

As the seventh transistor T7 is turned on, the low-potential voltage VSS is applied to the drain electrode of the sixth transistor T6 so that the sixth transistor T6 is turned on, and a driving current is provided to the light emitting element 120, causing the light emitting element 120 to emit light. Accordingly, the third period P3 can also be referred to as a coupling and light emission period.

In the third period P3, the reference voltage Vref provided through the third transistor T3 is maintained at the first node N1, and the voltage of the fourth node N4, changed by the driving current $I_D$, is maintained through the third capacitor C3. Accordingly, during the emission period, the first capacitor C1 and the third capacitor C3 maintain the voltage of the second node N2 to stay constant, so that the sixth transistor T6 can provide a constant driving current to the light emitting element 120. Further, as the second capacitor C2 maintains a constant voltage of the light emitting element 120, the light emitting element 120 can emit light while maintaining the same luminance (e.g., a luminance drop can be prevented).

In the third period P3, the gate voltage of the sixth transistor T6 is VDD+Vth−Vdata+Vref and the source voltage is VDD, so that the driving current $I_{ID}$ of the sixth transistor T6 is equal to Equation 1.

$$I_D = k\{VDD-(VDD+Vth-Vdata+Vref)-|Vth|\}^2 = k(Vdata-Vref)$$  [Equation 1]

In Equation 1, k is a constant value for the characteristics of the driving element. Referring to Equation 1, the value of the threshold voltage Vth of the sixth transistor T6 is removed from the driving current $I_{ID}$, so that the driving current ID does not depend on the threshold voltage Vth of the sixth transistor T6 and is not affected by changes in the threshold voltage Vth. In this situation, the sixth transistor T6 is a P-type transistor.

The driving of the pixel circuit is described with reference to FIGS. 2 and 4. In FIG. 4, driving during the first period P1, the second period P2, and the third period P3 applies in the same manner as that of FIG. 3, and no detailed description thereof is thus given below.

Referring to FIGS. 2 and 4, the first scan signal S1 includes a first dummy scan signal section DS1, and the second scan signal S2 includes a second dummy scan signal section DS2. The period when the first dummy scan signal section DS1 is provided is referred to as a dummy period DP. The dummy period DP occurs before the first period P1.

Each of the first scan signal S1 and the second scan signal S2 includes a signal section of the gate low voltage for two horizontal periods 2H. The second scan signal S2 includes a signal section of the gate low voltage for at least two horizontal periods 2H, and the light emission signal EM includes a signal section of the gate high voltage for at least two horizontal periods 2H.

The first scan signal S1, the second scan signal S2, and the light emission signal EM swing between the gate low voltage and the gate high voltage. The signal section of the gate low voltage of the second scan signal S2 occurs before the signal section of the gate low voltage of the first scan signal S1 and can overlap by about one horizontal period (1H).

The data voltage Vdata provided to the subpixel SP disposed in the nth row is provided while the first scan signal S1 is the signal section of the gate low voltage. The data voltage provided to the subpixel SP disposed in the nth row is denoted as Vdata(n).

The signal section of the gate low voltage of the first scan signal S1 when Vdata(n) is applied is referred to as a first driving scan signal section RS1. The first scan signal S1 includes a first dummy scan signal section DS1 and a first driving scan signal section RS1, and the first dummy scan signal section DS1 occurs before the first driving scan signal section RS1. The signal section of the gate low voltage of the second scan signal S2 overlapping the first drive scan signal section RS1 is referred to as a second driving scan signal section RS2. The second scan signal S2 includes a second dummy scan signal section DS2 and a second driving scan signal section RS2, and the second dummy scan signal section DS2 occurs before the second driving scan signal section RS2.

Specifically, the period when the first dummy scan signal section DS1 and the second dummy scan signal section DS2 overlap with each other before the first period P1 can be referred to as the first dummy period DP1, and the period when the first dummy scan signal section DS1 does not overlap with the second dummy scan signal section DS2 can be referred to as a second dummy period DP2. Specifically, the second dummy period DP2 is the period when the gate high voltage of the second scan signal S2 and the first dummy scan signal section DS1 overlap with each other. The dummy period DP can include a first dummy period DP1 and a second dummy period DP2. Each of the first dummy period DP1 and the second dummy period DP2 can be one horizontal period 1H.

During the first dummy period DP1, the first transistor T1 is turned on to apply the data voltage Vdata to the first node N1, the fourth transistor T4 is turned on to conduct the second node N2 and the third node N3, the second transistor T2 is turned on to conduct the anode and the fourth node N4, and the fifth transistor T5 is turned on to provide the reference voltage Vref to the third node N3.

In the first dummy period DP1, the fourth node N4 becomes the high-potential voltage VDD, and the second node N2 and the third node N3 are initialized to the reference voltage Vref. Accordingly, the first dummy period DP1 can also be referred to as a dummy initialization period.

In the second dummy period DP2, the first transistor T1, the second transistor T2, and the fourth transistor T4 remain turned on, and the fifth transistor T5 is turned off.

In the second dummy period DP2, the fourth node N4 can maintain the high-potential voltage VDD, and the reference voltage Vref applied to the third node N3 is cut off so that the threshold voltage Vth of the sixth transistor T6 is sampled to the second node N2 due to the second node N2 and the third node N2 are electrically connect. Accordingly, the second dummy period DP2 can also be referred to as a dummy sampling period.

In the second dummy period DP2, the data voltage Vdata input to the first node N1 is a dummy data voltage, and can be a dummy data voltage or a data voltage input to any one of the rows before the nth row. This is described below in detail with reference to FIG. 7.

When the pixel circuit is driven, the data voltage Vdata can be previously applied to the first node N1 through the dummy period DP before the first period P1. For example, as the screen is switched from a low to high grayscale (e.g., from black to white, or from a dark image to a bright image), the sampling error due to the variation in the gate-source voltage Vgs of the driving transistor can be reduced by previously applying the data voltage Vdata through the dummy period DP after the screen switch. In other words, the pixel circuit can pre-charge or pre-apply the data voltage Vdata during the dummy period DP to help prepare the pixel circuit for the display transition of switching from a dark scene to a bright scene. Accordingly, as the display device according to an embodiment of the disclosure has the dummy period DP before the first period P1, it is possible to mitigate or prevent luminance reduction and enhance the response speed of the display device by previously charging the first node N1 of the pixel circuit with the data voltage Vdata.

Meanwhile, if the first scan signal S1 is continuously and repeatedly opened to perform the first period P1 after the dummy period DP upon driving the pixel circuit, the data voltage Vdata is not applied to the second node N2 so that the corresponding condition may not be applied even though the data voltage Vdata is changed. In this situation, the signal is opened means turning on the transistors whose gate electrodes are connected to the signal lines.

Thus, the driving of the pixel circuit of the display device according to an embodiment of the disclosure includes a coupling period CP between the dummy period DP and the first period P1. In the coupling period CP, the light emission signal EM has a gate low voltage signal section. The signal section of the gate low voltage of the light emission signal EM in the coupling period CP is referred to as a dummy light emission signal section DE. In a light emission period to be described below, the signal section of the gate low voltage of the light emission signal EM is referred to as a driving light emission signal section RE. The light emission signal EM can include a dummy light emission signal section DE and a driving light emission signal section RE. The dummy light emission signal section DE occurs prior to the driving light emission signal section RE.

In the coupling period CP, the third transistor T3 and the seventh transistor T7 are turned on by the dummy light emission signal section DE of the light emission signal EM. The data voltage Vdata applied to the first node N1 in the dummy period DP is applied to the second node N2 by the turned-on third transistor T3 in the coupling period CP. The first node N1 is changed from the data voltage Vdata to the reference voltage Vref by the third transistor T3 turned on during the coupling period CP. The voltage variation of the first node N1 is applied to the second node N2 due to the coupling phenomenon of the first capacitor C1. For example, even when the data voltage is changed as the screen is switched from a low grayscale to a high grayscale, the changed data voltage can be applied to the gate electrode of the driving transistor through the coupling period CP. Since the coupling period CP actually occurs before initialization of the pixel circuit, sampling, and light emission, it can also be referred to as a dummy coupling period.

According to an embodiment of the disclosure, the driving of the pixel circuit of the display device can include a dummy period DP and a coupling period CP before the initialization period, so that the response speed delay that occurs instantaneously upon switching screens of the display device can be mitigated. In other words, the switching delay can be carried out ahead of time or "cleared out" before the display period (e.g., priming the pixel circuit before the display period).

Figure 5:
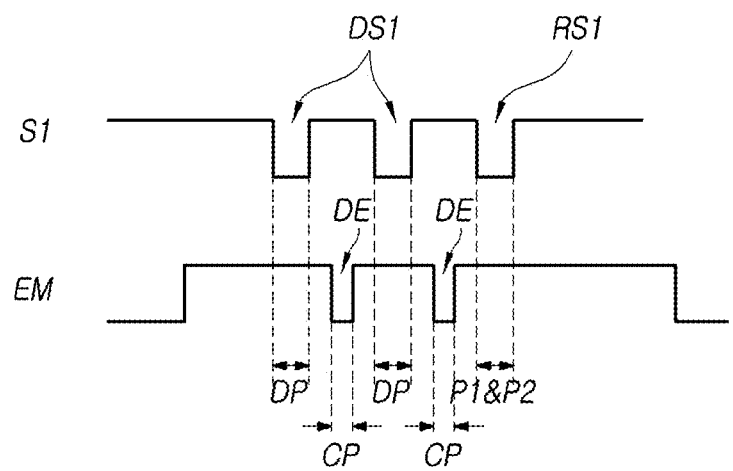
FIG. 5 is a view illustrating waveforms of gate signals according to another embodiment of the disclosure.

FIG. 5 is a view illustrating waveforms of gate signals according to another embodiment of the disclosure.

The first scan signal S1 described above in connection with FIGS. 3 and 4 includes one dummy scan signal section. FIG. 5 illustrates that the first scan signal S1 includes two dummy scan signal sections DS1, and the light emission signal EM includes two dummy light emission signal sections DE.

As in the situation of FIGS. 3 and 4, it is possible to provide a sufficient data voltage to the gate electrode of the driving transistor during one dummy period and one coupling period, but depending on the performance of the display device, a plurality of dummy periods and coupling periods can be used.

For example, as shown in FIG. 5, two dummy periods DP and two coupling periods CP can be included to enhance the response speed of the display device. The dummy scan signal section DS1 and the dummy light emission signal section DE do not overlap with each other but are alternately disposed. After the last dummy light emission signal section DE, the first driving scan signal section RS1 of the first scan signal S1 for the first period P1 and the second period P2 follows. For example, a center of dummy light emission signal section DE can be aligned to occur between two adjacent dummy light emission signal sections DE, but embodiments are not limited thereto.

Figure 6:
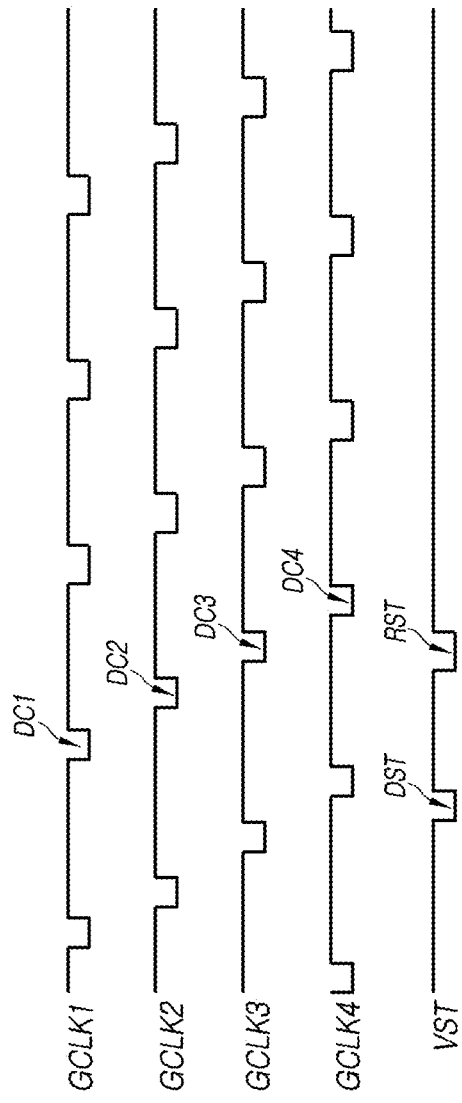
FIG. 6 is a view illustrating waveforms of signals input to a gate driving circuit included in a display device according to an embodiment of the disclosure.

FIG. 6 is a view illustrating waveforms of signals input to a gate driving circuit included in a display device according to an embodiment of the disclosure.

The signal waveform diagram of FIG. 6 illustrates an example of a gate driving circuit using 4-phase gate clocks GCLK1, GCLK2, GCLK3, and GCLK4. The first gate clock GCLK1, the second gate clock GCLK2, the third gate clock GCLK3, and the fourth gate clock GCLK4 are input to the gate driving circuit, and a scan signal is output through the gate driving circuit. For example, the gate driving circuit can be a circuit for outputting the first scan signal S1 or can be a circuit for outputting the second scan signal S1.

FIG. 6 illustrates a gate driving circuit for outputting a first scan signal S1, wherein the gate driving circuit outputs one dummy scan signal section.

In order for the first scan signal S1 to output one first dummy scan signal section DS1, the first gate clock GCLK1 includes one first dummy clock signal section DC1, the second gate clock GCLK2 includes one second dummy clock signal section DC2, the third gate clock GCLK3 includes one third dummy clock signal section DC3, and the fourth gate clock GCLK4 includes one fourth dummy clock signal section DC4.

Further, a start signal VST is input to the gate drive circuit to cause the gate drive circuit to start operating, wherein the start signal VST includes a dummy start signal section DST for the start of the dummy clock signal sections DC1, DC2, DC3, and DC4.

The first gate clock GCLK1, the second gate clock GCLK2, the third gate clock GCLK3, and the fourth gate clock GCLK4 are signals having a signal section of the gate low voltage at regular intervals. Therefore, since the dummy start signal section DST is generated, the dummy clock signal sections DC1, DC2, DC3, and DC4 are determined among the signal sections of the periodically generated gate clocks GCLK1, GCLK2, GCLK3, and GCLK4. The signal sections of gate clocks following the dummy start signal section DST become dummy clock signal sections DC1, DC2, DC3, and DC4.

The start signal VST includes a dummy start signal section DST and a driving start signal section RST following the dummy start signal section DST. The driving start signal section RST is a start signal VST input to the gate driving circuit to output the first driving scan signal section RS1.

The number of dummy clock signal sections DC1, DC2, DC3, and DC4 and the number of dummy start signal sections DST are determined according to the number of first dummy scan signal sections DS1. The number of dummy clock signal sections DC1, DC2, DC3, and DC4 and the number of dummy start signal sections DST are determined to be equal to the number of first dummy scan signal sections DS1.

Figure 7:
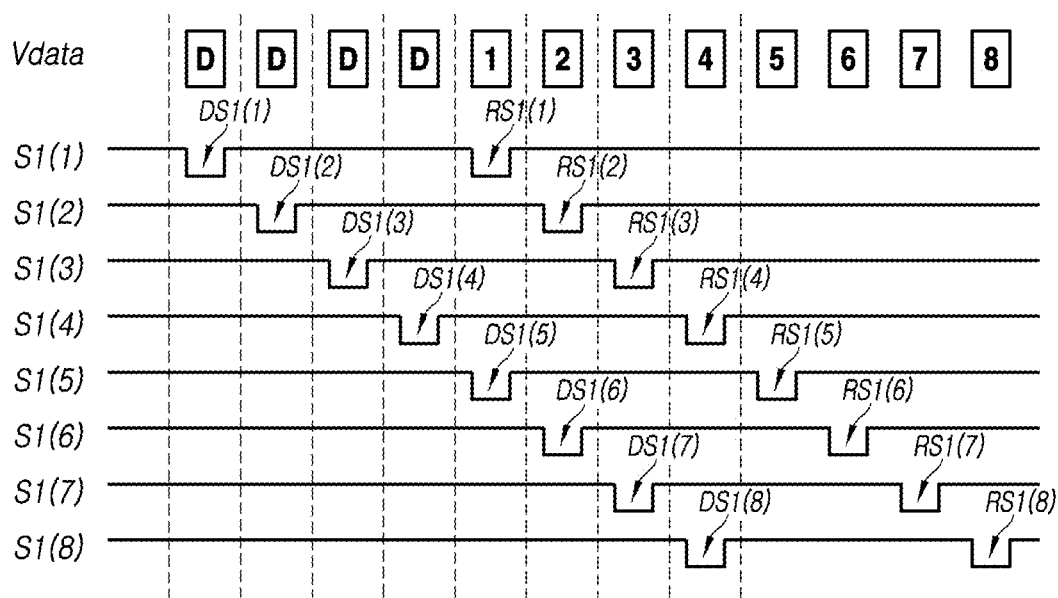
FIG. 7 is a view illustrating a waveform of a gate signal input to a pixel circuit included in a display device according to an embodiment of the disclosure.

FIG. 7 is a view illustrating a waveform of a gate signal input to a pixel circuit included in a display device according to an embodiment of the disclosure. Like FIG. 6, FIG. 7 regards the first scan signal S1 and illustrates a situation where the gate driving circuit outputs one dummy scan signal section.

The first dummy scan signal section DS1 is output from the gate driving circuit by the dummy clock signal sections DC1, DC2, DC3, and DC4 described above. FIG. 7 illustrates the waveforms of a first scan signal S1(1) input to a first pixel row, a first scan signal S1(2) input to a second pixel row, a first scan signal S1(3) input to a third pixel row, a first scan signal S1(4) input to a fourth pixel row, a first scan signal S1(5) input to a fifth pixel row, a first scan signal S1(6) input to a sixth pixel row, a first scan signal S1(7) input to a seventh pixel row, and a first scan signal S1(8) input to an eighth pixel row, as well as the data voltage Vdata input in synchronization with the first scan signal. In this situation, the pixel row refers to a plurality of subpixels disposed in a row direction, and the first pixel row refers to the subpixels disposed first in a column direction among the plurality of subpixels disposed in the row direction.

The first scan signals S1(1), S1(2), S1(3), S1(4), S1(5), S1(6), S1(7), and S1(8) input to the first through eighth pixel rows, respectively, include first dummy scan signal sections DS1(1), DS1(2), DS1(3), DS1(4), DS1(5), DS1(6), DS1(7), and DS1(8), respectively.

When the first dummy scan signal section DS1(1) of the first scan signal S(1) input to the first pixel row is input to the pixel circuit, the first transistor T1 is turned on to apply the data voltage Vdata to the first node N1.

As described above, since the period when the first dummy scan signal section DS1 is input is the dummy period DP, the input data voltage Vdata can be a dummy data voltage or a data voltage input to one of the previous pixel rows. For example, the subpixel can be primed ahead of time during the dummy period DP with the data voltage Vdata from a preceding row.

In the situation of the first dummy scan signal section DS1(1) of the first scan signal S1(1) input to the first pixel row, the data voltage Vdata in the dummy period when the first dummy scan signal section DS1(1) occurs is the dummy data voltage D.

The first scan signal S1(1) input to the first pixel row includes the first driving scan signal section RS1(1) after the first dummy scan signal section DS1(1). In the first period P1 and the second period P2 when the first driving scan signal section RS1(1) occurs, the data voltage Vdata(1) for driving the pixel circuits included in the first pixel row is applied.

The data driver outputting the data voltage Vdata outputs a plurality of dummy data voltages D before outputting the data voltage Vdata(1) (e.g., the actual data voltage or real image data) for driving the pixel circuits included in the first pixel row.

The number of outputs of the dummy data voltage D is determined as the product of the number of first dummy scan signal sections DS1 and the number of gate clock phases input to the gate driving circuit. In this situation, since the number of first dummy scan signal sections DS1 is 1 and the number of gate clock phases is 4, the number of outputs of the dummy data voltage D is 4 (e.g., 1×4=4).

Accordingly, the data driver outputs four dummy data voltages D before outputting the data voltage Vdata(1) for driving the first pixel circuit.

When the first dummy scan signal section DS1(1) of the first scan signal S1(1) to the fourth dummy scan signal section DS1(4) of the first scan signal S1(4) are input, the dummy data voltage D is applied as the data voltage Vdata.

When the first dummy scan signal section DS1(5) of the first scan signal S1(5) is input to the fifth pixel row, the first driving scan signal section RS1(1) of the first scan signal S1(1) is input to the first pixel row (e.g., DS1(5) can overlap with RS1(1)). In this situation, the data voltage Vdata is thus the data voltage Vdata(1) for driving the pixel circuits included in the first pixel row.

The pixel circuits included in the first pixel row are initialized and sampled by the data voltage Vdata(1) input in synchronization with the first driving scan signal section RS1(1) of the first scan signal S1(1), and the pixel circuits included in the fifth pixel row are dummy-driven by the data voltage Vdata(1) input in synchronization with the first dummy scan signal section DS1(5) of the first scan signal S1(5). In other words, the actual data voltage Vdata(1) for the first row can be also used at the same time as the dummy voltage data for priming or pre-charging the fifth row. Dummy driving refers to driving through the first dummy period DP1 and the second dummy period DP2 or the dummy period DP.

Likewise, when the first dummy scan signal section DS1(6) of the first scan signal S1(6) is input to the sixth pixel row, the first driving scan signal section RS1(2) of the first scan signal S1(2) is input to the second pixel row. In this situation, the data voltage Vdata is thus the data voltage Vdata(2) for driving the pixel circuits included in the second pixel row. In other words, the actual data voltage Vdata(2) for the second row can be also used at the same time as the dummy voltage data for priming or pre-charging the sixth row.

The pixel circuits included in the second pixel row are initialized and sampled by the data voltage Vdata(2) input in synchronization with the first driving scan signal section RS1(2) of the first scan signal S1(2), and the pixel circuits included in the sixth pixel row are dummy-driven by the data voltage Vdata(2) input in synchronization with the first dummy scan signal section DS1(6) of the first scan signal S1(6).

Accordingly, the data voltage Vdata input in synchronization with the first dummy scan signal section DS1 is the dummy data voltage D or the data voltage Vdata(n-m) input to the (n-m)th pixel row. In this situation, n is the order of the pixel rows, and m is the number of outputs of the dummy data voltage D, where n and m are positive integers.

The structure of the subpixel SP of the display device 100 according to an embodiment of the disclosure is described below with reference to FIG. 8.

Figure 8:
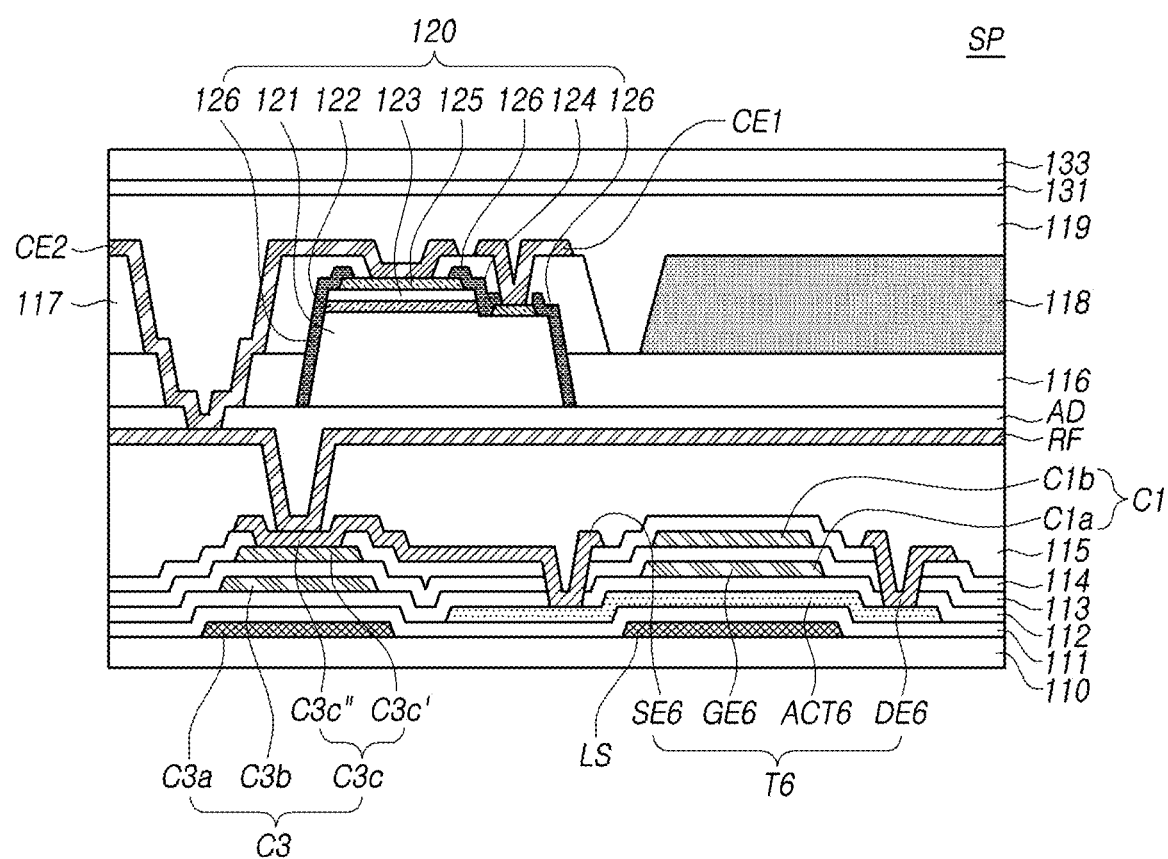
FIG. 8 is a cross-sectional view illustrating a portion of a subpixel included in a display device according to an embodiment of the disclosure.

FIG. 8 is a cross-sectional view illustrating a portion of a subpixel included in a display device according to an embodiment of the disclosure. Specifically, FIG. 8 illustrates a light emitting element 120, a sixth transistor T6, and a third capacitor C3 disposed in a subpixel SP.

Referring to FIGS. 8 and 2 together, a light blocking layer LS is disposed in each of the plurality of subpixels SP on the substrate 110. The light blocking layer LS blocks light incident from under the substrate 110 to the active layers of the plurality of transistors, thereby minimizing leakage current. For example, the light blocking layer LS can be disposed under the sixth active layer ACT6 of the sixth transistor T6 that functions as a driving transistor, and can block the light incident on the sixth active layer ACT6. If the sixth active layer ACT6 is irradiated with light, leakage current can occur, deteriorating reliability of the sixth transistor T6. Accordingly, the reliability of the sixth transistor T6 can be enhanced by disposing the light blocking layer LS for blocking light on the substrate 110. The light blocking layer LS can be formed of an opaque conductive material, such as copper (Cu), aluminum (Al), molybdenum (Mo), nickel (Ni), titanium (Ti), chromium (Cr) or an alloy thereof, but is not limited thereto.

A buffer layer 111 is disposed on the light blocking layer LS. The buffer layer 111 can reduce penetration of moisture or impurities through the substrate 110. The buffer layer 111 can include, e.g., a single layer or multiple layers of silicon oxide (SiOx) or silicon nitride (SiNx), but is not limited thereto. However, the buffer layer 111 can be omitted depending on the type of substrate 110 or the type of thin film transistor, but is not limited thereto.

A sixth transistor T6 including a sixth active layer ACT6, a sixth gate electrode GE6, a sixth source electrode SE6 and a sixth drain electrode DE6 is disposed on the buffer layer 111.

A sixth active layer ACT6 is disposed on the buffer layer 111. The sixth active layer ACT6 can be formed of a semiconductor material, such as an oxide semiconductor, amorphous silicon or polysilicon, but is not limited thereto.

The first capacitor C1 can include a first capacitor electrode C1a and a second capacitor electrode C1b. A gate insulation layer 112 is disposed on the sixth active layer ACT6, and a sixth gate electrode GE6 is disposed on the gate insulation layer 112. The sixth gate electrode GE6 is connected to the first capacitor electrode C1a of the first capacitor C1 and the fourth transistor T4. The sixth gate electrode GE6 can be formed of an opaque conductive material, such as copper (Cu), aluminum (Al), molybdenum (Mo), nickel (Ni), titanium (Ti), chromium (Cr) or an alloy thereof, but is not limited thereto.

A first inter-layer insulation layer 113 and a second inter-layer insulation layer 114 are disposed on the sixth gate electrode GE6, and a sixth source electrode SE6 and a sixth drain electrode DE6 electrically connected to the sixth active layer ACT6 are disposed on the second inter-layer insulation layer 114. The sixth source electrode SE6 is connected to the second capacitor C2, the third capacitor C3, and the cathode electrode 125 of the light emitting element 120. The sixth drain electrode DE6 is connected to the fifth transistor T5 and the seventh transistor T7. The sixth source electrode SE6 and the sixth drain electrode DE6 can be formed of an opaque conductive material, such as copper (Cu), aluminum (Al), molybdenum (Mo), nickel (Ni), titanium (Ti), chromium (Cr) or an alloy thereof, but is not limited thereto.

A third capacitor C3 is disposed on the substrate 110. The third capacitor C3 can include a 3-1th capacitor electrode C3a, a 3-2th capacitor electrode C3b, and a 3-3th capacitor electrode C3c. The third capacitor C3 can include a 3-1th capacitor electrode C3a as a lower capacitor electrode, a 3-2th capacitor electrode C3b as an intermediate capacitor electrode, and a 3-3th capacitor electrode C3c as an upper capacitor electrode.

A 3-1th capacitor electrode C3a is disposed on the substrate 110. The 3-1th capacitor electrode C3a is a portion extending from the light blocking layer LS and can be integrally formed with the light blocking layer LS. In this situation, the 3-1th capacitor electrode C3a can be electrically connected to the second capacitor C2 and the sixth source electrode SE6 through contact holes formed in the buffer layer 111 and the gate insulation layer 112.

A 3-2th capacitor electrode C3b is disposed on the buffer layer 111 and the gate insulation layer 112. The 3-2th capacitor electrode C3b is a portion extending from the sixth gate electrode GE6 and can be disposed to overlap the 3-1th capacitor electrode C3a. The 3-2th capacitor electrode C3b can be electrically connected to the sixth gate electrode GE6 and the second source electrode SE2 of the sixth transistor T6.

A 3-3th capacitor electrode C3c is disposed on the first inter-layer insulation layer 113. The 3-3th capacitor electrode C3c can include a first layer C3c' and a second layer C3c". The first layer C3c' of the 3-3th capacitor electrode C3c can have an island-shaped pattern formed of the same material on the same layer as the second capacitor electrode C1b included in the first capacitor C1. The first layer C3c' can be disposed to overlap the 3-1th capacitor electrode C3a and the 3-2th capacitor electrode C3b with the first inter-layer insulation layer 113 interposed therebetween.

The second layer C3c" of the 3-3th capacitor electrode C3c is disposed on the second inter-layer insulation layer 114. The second layer C3c" is a portion extending from the sixth source electrode SE6 and can be connected to the first layer C3c' through the contact hole of the second inter-layer insulation layer 114.

Meanwhile, a first scan line SL1, a second scan line SL2, and a light emission line EL are disposed on the gate insulation layer 112. The first scan line SL1, the second scan line SL2, and the light emission line EL extend in the row direction and can be disposed along a plurality of subpixels SP disposed in the same row. Further, the plurality of subpixels SP included in the nth row receive the scan signal of the n−1th first scan line SL1 disposed in the n−1th row. In other words, the second scan line SL2 disposed in the nth row can be the first scan line SL1 disposed in the n−1th row.

The first scan line SL1 can be integrated with the first gate electrode and the fourth gate electrode to transfer the first scan signal S1 to the first transistor T1 and the fourth transistor T4, turning on or off the first transistor T1 and the fourth transistor T4. The second scan line SL2 can be integrated with the second gate electrode to transfer the second scan signal S2 to the second transistor T2, turning on or off the second transistor T2. The light emission line EL can be integrated with the third gate electrode and the seventh gate electrode to transfer the light emission signal EM to the third transistor T3 and the seventh transistor T7, turning on or off the third transistor T3 and the seventh transistor T7. Further, the n−1th first scan line SL1 can be integrated with the fifth gate electrode to transfer the n−1th first scan signal S1(n−1) to the fifth transistor T5, turning on or off the fifth transistor T5.

A reference voltage line VL3 can be disposed on the first inter-layer insulation layer 113. The reference voltage line VL3 can extend in the row direction and can be disposed along a plurality of subpixels SP disposed in the same row.

A data line DL, a high-potential voltage line VL1, and a low-potential voltage line VL2 are disposed on the second inter-layer insulation layer 114. The data line DL, the high-potential voltage line VL1 and the low-potential voltage line VL2 can extend in the column direction and can be disposed along a plurality of subpixels SP disposed in the same column.

A passivation layer 115 can be disposed on the first transistor T1, the second transistor T2, the third transistor T3, the fourth transistor T4, the fifth transistor T5, the sixth transistor T6, the seventh transistor T7, the first capacitor C1, the second capacitor C2, and the third capacitor C3. The passivation layer 115 is an insulation layer for protecting the components under the passivation layer 115, and can be formed of either an inorganic material, such as silicon oxide (SiOx) or silicon nitride (SiNx), or an organic material, such as benzocyclobutene or acrylic, but is not limited thereto.

A reflector RF is disposed on the passivation layer 115. The reflector RF is a reflector RF for reflecting the light emitted from the light emitting element 120 upward of the substrate 110 and can be formed in a shape corresponding to each of a plurality of subpixels SP.

An adhesive layer AD is disposed on the reflector RF. The adhesive layer AD is a layer for fixing the light emitting element 120 disposed on the adhesive layer AD, and can be formed of an adhesive material, such as resin, but is not limited thereto.

The light emitting element 120 is disposed on the adhesive layer AD. The light emitting element 120 is an element that emits light by current and can include a light emitting element 120 that emits red light, green light, blue light, or light of various colors including white, as a combination thereof. For example, the light emitting element 120 can be an inorganic material-based light emitting diode (LED) or a micro LED, but is not limited thereto.

The light emitting element 120 includes a first semiconductor layer 121, a light emitting layer 122, a second semiconductor layer 123, an anode electrode 124, a cathode electrode 125, and a passivation film 126.

The first semiconductor layer 121 is disposed on the adhesive layer AD, and the second semiconductor layer 123 is disposed on the first semiconductor layer 121. The first semiconductor layer 121 and the second semiconductor layer 123 can be layers formed by doping a specific material with n-type and p-type impurities. For example, the first semiconductor layer 121 and the second semiconductor layer 123 can be layers formed by doping a material, such as gallium nitride (GaN), indium aluminum phosphide (InAlP), or gallium arsenide (GaAs), with p-type or n-type impurities. The p-type impurities can be magnesium (Mg), zinc (Zn), or beryllium (Be), and the n-type impurities can be silicon (S1), germanium (Ge), or tin (Sn), but are not limited thereto.

The light emitting layer 122 is disposed between the first semiconductor layer 121 and the second semiconductor layer 123. The light emitting layer 122 can emit light by receiving holes and electrons from the first semiconductor layer 121 and the second semiconductor layer 123. The light emitting layer 122 can have a single-layer or multi-quantum well (MQW) structure and can be formed of, e.g., indium gallium nitride (InGaN) or gallium nitride (GaN), but is not limited thereto.

An anode electrode 124 is disposed on the first semiconductor layer 121, and a cathode electrode 125 is disposed on the second semiconductor layer 123. In this situation, to dispose the anode electrode 124 on the first semiconductor layer 121, the first semiconductor layer 121 can partially protrude from the light emitting layer 122 and the second semiconductor layer 123. The anode electrode 124 can be formed on a portion of the upper surface of the first semiconductor layer 121 protruding from the light emitting layer 122 and the second semiconductor layer 123, and the cathode electrode 125 can be formed on the upper surface of the second semiconductor layer 123.

Meanwhile, the passivation film 126 surrounding the light emitting element 120 can cover at least a side surface of the first semiconductor layer 121, a side surface of the light emitting layer 122, and a side surface of the second semiconductor layer 123 of the light emitting element 120 among the outer surfaces of the light emitting element 120. The passivation film 126 surrounding the light emitting element 120 can be formed to prevent electrical shorting of the first semiconductor layer 121 and the second semiconductor layer 123 when forming the anode electrode 124 and the cathode electrode 125.

The plurality of pixels PX can include at least one subpixel SP in which a main light emitting element and an auxiliary light emitting element are disposed. For example, each of the first subpixel SP1 and the second subpixel SP2 can include only one light emitting element. The first subpixel SP1 includes a red main light emitting element. The second subpixel SP2 includes a red main light emitting element. In this situation, the red main light emitting element included in the second subpixel SP2 can be referred to as a redundancy light emitting element. Each of the third subpixel SP3 and the fourth subpixel SP4 can include a main light emitting element and an auxiliary light emitting element. The third subpixel SP3 includes a green main light emitting element and a green auxiliary light emitting element. The fourth subpixel SP4 includes a blue main light emitting element and a blue auxiliary light emitting element. In this situation, the green auxiliary light emitting element and the blue auxiliary light emitting element can be referred to as a redundant light emitting element.

A planarization layer including a first planarization layer 116 and a second planarization layer 117 is disposed on the light emitting element 120 and the adhesive layer AD. The planarization layer can planarize an upper portion of the substrate 110 where the light emitting element 120 is disposed and fix and protect the light emitting element 120. Each of the first planarization layer 116 and the second planarization layer 117 can be composed of a single layer or a multi-layer structure and be formed of, e.g., benzocyclobutene or acryl-based organic material, but is not limited thereto.

A connection electrode CE connecting the light emitting element 120 to the pixel circuit and the high-potential voltage line VL1 is disposed on the planarization layer. The connection electrode CE includes a first connection electrode CE1 and a second connection electrode CE2.

The first connection electrode CE1 is an electrode that electrically connects the anode electrode 124 of the light emitting element 120 and the high-potential voltage line VL1. The first connection electrode CE1 can be connected to the anode electrode 124 of the light emitting element 120 through a contact hole formed in the second planarization layer 117.

The second connection electrode CE2 is an electrode that electrically connects the cathode electrode 125 of the light emitting element 120 with the sixth source electrode SE6 of the sixth transistor T6, the third capacitor C3, and the second capacitor C2. The second connection electrode CE2 can be connected to the reflector RF of each of the plurality of subpixels SP through contact holes formed in the adhesive layer AD, the first planarization layer 116, and the second planarization layer 117. In this situation, since the reflector RF is connected to the sixth source electrode SE6 of the sixth transistor T6, the third capacitor C3, and the second capacitor C2, the sixth source electrode SE6 of the sixth transistor T6, the third capacitor C3, and the second capacitor C2 can be electrically connected with the cathode electrode 125 of the light emitting element 120 through the reflector RF and the second connection electrode CE2.

A bank 118 is disposed on the planarization layer. As shown in the drawings, the bank 118 can be disposed on the first planarization layer 116 exposed from the second planarization layer 117 of the planarization layer, and can be disposed on the second planarization layer 117, but is not limited thereto. The bank 118 can be formed of an opaque material to reduce color mixing between the plurality of subpixels SP. For example, the bank 118 can be formed of black resin, but is not limited thereto.

A protection layer 119 is disposed on the first connection electrode CE1, the second connection electrode CE2 and the bank 118. The protection layer 119 is a layer for protecting the structure under the protection layer 119, and can be composed of a single layer or multiple layers of light transmitting epoxy, silicon oxide (SiOx) or silicon nitride (SiNx), but is not limited thereto.

A protection film 133 is disposed on the protection layer 119. The protection film 133 is attached to the protection layer 119 through the adhesive film 131. The protection film 133 can be an anti-shattering film that can protect the structure under the protection film 133 and prevent fragments from scattering when the structure under the protection film 133 is broken. The protection film 133 can be an optical film formed of an inorganic material, such as PET, and the protection film 133 and the adhesive film 131 can be laminated together and be attached onto the protection layer 119. The adhesive film 131 is formed of a transparent optical adhesive material. For example, the adhesive film 131 can be an optically clear adhesive (OCA) in a film form or an optically clear resin (OCR) in an amorphous liquid form, but is not limited thereto.

A display device according to embodiments of the disclosure can be described as follows.

A display device according to an embodiment of the disclosure comprises a light emitting element and a pixel circuit providing a driving current to the light emitting element. The pixel circuit includes a driving transistor having a gate electrode, a source electrode, and a drain electrode, a first capacitor having a first electrode connected with the gate electrode and a second electrode connected with a first node, a first transistor connected between the second electrode and a data line and controlled by a first scan signal, a first light emission transistor connected between the second electrode and a reference voltage line and controlled by a light emission signal, and a second light emission transistor connected between the drain electrode and a low-potential voltage line and controlled by the light emission signal.

The first scan signal includes a first dummy scan signal section (also referred to as "first dummy scan pulse") having a first voltage level for turning on the first transistor and a first driving scan signal section (also referred to as "first driving scan pulse"). A signal section between the first dummy scan signal section and the first driving scan signal section has a second voltage level different from the first voltage level.

The light emission signal includes a dummy light emission signal section for turning on the first light emission transistor and the second light emission transistor between the first dummy scan signal section and the first driving scan signal section.

According to another feature of the disclosure, the light emission signal can turn off the first light emission transistor and the second light emission transistor while the first dummy scan signal section and the first driving scan signal section turn on the first transistor.

According to another feature of the disclosure, the light emission signal can turn off the first light emission transistor and the second light emission transistor between a first timing when the first transistor is turned on by the first dummy scan signal section and a second timing when the first transistor is turned on by the first driving scan signal section.

According to another feature of the disclosure, the light emitting element can include an anode electrode and a cathode electrode, and the anode electrode can be connected to a high-potential voltage line, and the cathode electrode can be connected to the source electrode.

According to another feature of the disclosure, the driving transistor, the first transistor, the first light emission transistor, and the second light emission transistor can be polycrystalline transistors.

According to another feature of the disclosure, the display device can further comprise a second transistor controlled by the first scan signal and connected with the anode electrode and the cathode electrode.

According to another feature of the disclosure, each of the first dummy scan signal section and the first driving scan signal section can have a temporal length of 2 horizontal periods. The pixel circuit can further include a transistor controlled by a second scan signal and connected between the drain electrode and the reference voltage line. The second scan signal can overlap the first scan signal by 1 horizontal period. Further, the second scan signal can include a second dummy scan signal section overlapping the first dummy scan signal section and a second driving scan signal section overlapping the first driving scan signal section.

According to another feature of the disclosure, the first scan signal can include two or more first dummy scan signal sections. A signal section between the two or more first dummy scan signal sections can have the second voltage level.

According to another feature of the disclosure, the number of dummy light emitting signal sections can be one smaller than the number of first dummy scan signal sections.

According to another feature of the disclosure, the display device can further comprise a second capacitor disposed between the gate electrode and the source electrode and a third capacitor disposed between the anode electrode and the cathode electrode.

A display device according to another embodiment of the disclosure comprises a substrate including a plurality of subpixels, a scan line and a light emission line disposed on the substrate in a first direction (e.g., row direction or column direction), scan transistors connected with the scan line on the substrate, light emission transistors connected with the light emission line on the substrate, a driving transistor disposed on the same plane as the scan transistors and the light emission transistors, and a light emitting element disposed in any one area on the scan transistors, the light emission transistors, and the driving transistors. In this situation, a scan signal applied to a first scan line includes a dummy scan signal section, and a light emission signal applied to the light emission line includes a dummy light emission signal section for turning on the light emission transistors after the dummy scan signal section.

According to another feature of the disclosure, the display device can further comprise a data line disposed in a second direction (e.g., column direction or row direction) crossing the first direction. The scan transistors can include a first scan transistor connected to the data line.

According to another feature of the disclosure, the display device can further comprise at least one gate driver disposed in a display area and disposed between the plurality of subpixels and a gate driver line transferring a signal to the gate driver.

According to another feature of the disclosure, the substrate can include a first pad area and a second pad area facing each other. A data pad connected with the data line and a gate pad connected with the gate driver line can be disposed in the first pad area.

According to another feature of the disclosure, the display device can further comprise a high-potential voltage line connected with an anode electrode of the light emitting element and a high-potential voltage pad connected with the high-potential voltage line. The high-potential voltage pad can be disposed in the first pad area.

According to another feature of the disclosure, the display device can further comprise a low-potential voltage line connected with at least one light emission transistor among the light emission transistors and a low-potential voltage pad connected with the low-potential voltage line. The low-potential voltage pad can be disposed in the second pad area.

According to another feature of the disclosure, the scan signal can include a driving scan signal section for turning on at least two or more scan transistors among the scan transistors after the dummy scan signal section. The dummy scan signal section and the driving scan signal section can be gate low voltages.

According to another feature of the disclosure, the scan transistors, the light emission transistors, and the driving transistor can be P-type transistors.

According to another feature of the disclosure, the display device can further comprise a reflective electrode disposed between at least one of the scan transistors, the light emission transistors, and the driving transistor and the light emitting element. The reflective electrode can overlap the light emitting element in a vertical direction.

Although the embodiments of the disclosure have been described in more detail with reference to the accompanying drawings, the disclosure is not necessarily limited to these embodiments, and can be variously modified without departing from the technical spirit of the disclosure. Accordingly, the embodiments set forth herein are provided for illustrative purposes, but not to limit the scope of the disclosure, and should be appreciated that the scope of the disclosure is not limited by the embodiments. Thus, it should be noted that the above-described embodiments are provided as examples and should not be interpreted as limiting. The scope of the disclosure should be construed by the following claims, and all technical spirits within equivalents thereof should be interpreted to belong to the scope of the disclosure.

What is claimed:

1. A display device, comprising: a light emitting element and a pixel circuit configured to provide a driving current to the light emitting element, wherein the pixel circuit includes: a driving transistor having a gate electrode, a source electrode, and a drain electrode; a first capacitor having a first electrode connected to the gate electrode of the driving transistor and a second electrode connected to a first node; a first transistor connected between the second electrode of the first capacitor and a data line, the first transistor being configured to operate based on a first scan signal; a first light emission transistor connected between the second electrode of the first capacitor and a reference voltage line, the first light emission transistor being configured to operate based on a light emission signal; and a second light emission transistor connected between the drain electrode of the driving transistor and a low-potential voltage line, the second light emission transistor being configured to operate based on the light emission signal, wherein the first scan signal sequentially includes a first dummy scan signal section and a first driving scan signal section having a first voltage level for turning on the first transistor, wherein a period having a signal section between a dummy period having the first dummy scan signal section and a period having the first driving scan signal section has a second voltage level different from the first voltage level, and wherein the light emission signal includes a coupling period having a dummy light emission signal section for turning on the first light emission transistor and the second light emission transistor between the dummy period the period having the first driving scan signal section and the period having the first driving scan signal section.

2. The display device of claim 1, wherein the light emission signal turns off both of the first light emission transistor and the second light emission transistor within a first time period during which the first transistor is turned on by the first dummy scan signal section and within a second time period during which the first transistor is turned on by the first driving scan signal section.

3. The display device of claim 1, wherein the light emitting element includes an anode electrode connected to a high-potential voltage line and a cathode electrode connected to the source electrode of the driving transistor.

4. The display device of claim 3, further comprising a second transistor configured to operate based on the first scan signal and connected between the anode electrode and the cathode electrode.

5. The display device of claim 1, wherein the driving transistor, the first transistor, the first light emission transistor, and the second light emission transistor are P-type transistors.

6. The display device of claim 1, wherein each of the dummy period and the period having the first driving scan signal section has a temporal length of 2 horizontal periods.

7. The display device of claim 6, wherein the pixel circuit further includes a fifth transistor configured to operate based on a second scan signal and connected between the drain electrode of the driving transistor and the reference voltage line, and
wherein the second scan signal includes a second driving scan signal section having the first voltage level overlapping the first driving scan signal section.

8. The display device of claim 7, wherein the second scan signal further includes a second dummy scan signal section having the first voltage level overlapping with the first dummy scan signal section.

9. The display device of claim 8, wherein the second dummy scan signal section and the second driving scan signal section overlap with the first dummy scan signal section and the first driving scan signal section by 1 horizontal period respectively.

10. The display device of claim 8, wherein the second dummy scan signal section and the second driving scan signal section occur before the first dummy scan signal section and the first driving scan signal section, respectively.

11. The display device of claim 1, wherein the first scan signal includes two or more dummy periods, and the light emission signal includes two or more coupling periods, and
wherein a signal section between the two or more dummy periods has the second voltage level.

12. The display device of claim 1, further comprising:
a second capacitor disposed between an anode electrode of the light emitting element and a cathode electrode of the light emitting element; and
a third capacitor disposed between the gate electrode of the driving transistor and the source electrode of the driving transistor,
wherein the third capacitor is connected between the first capacitor and the second capacitor.

13. A display device, comprising:
a plurality of subpixels disposed on a substrate;
a scan line and a light emission line disposed on the substrate in a first direction;
scan transistors disposed on the substrate and connected with the scan line;
light emission transistors disposed on the substrate and connected with the light emission line;
a driving transistor disposed on a same plane as the scan transistors and the light emission transistors; and
a light emitting element disposed on at least one of the scan transistors, the light emission transistors, and the driving transistor,
wherein a scan signal applied to the scan line includes a dummy scan signal section for turning on two or more scan transistors among the scan transistors, wherein a light emission signal applied to the light emission line includes a dummy light emission signal section for turning on the light emission transistors, and wherein a period for applying the dummy light emission signal section is after a dummy period for applying the dummy scan signal section.

14. The display device of claim 13, further comprising a data line disposed in a direction crossing the first direction,
wherein the scan transistors include a first scan transistor connected to the data line.

15. The display device of claim 14, further comprising:
at least one gate driver disposed in a non-display area of the substrate between at least two adjacent subpixels among the plurality of subpixels; and
a gate driver line configured to transfer a signal to the at least one gate driver.

16. The display device of claim 15, further comprising:
a first pad area and a second pad area disposed on the substrate, and
wherein a data pad connected with the data line and a gate pad connected with the gate driver line are disposed in the first pad area.

17. The display device of claim 16, further comprising:
a high-potential voltage line connected with an anode electrode of the light emitting element; and
a high-potential voltage pad connected with the high-potential voltage line,
wherein the high-potential voltage pad is disposed in the first pad area.

18. The display device of claim 16, further comprising:
a low-potential voltage line connected with at least one light emission transistor among the light emission transistors; and
a low-potential voltage pad connected with the low-potential voltage line,
wherein the low-potential voltage pad is disposed in the second pad area.

19. The display device of claim 13, wherein the scan signal includes a driving scan signal section for turning on the two or more scan transistors among the scan transistors after the dummy scan signal section and the dummy light emission signal section.

20. The display device of claim 19, wherein the dummy scan signal section and the driving scan signal section are gate low voltages.

21. The display device of claim 13, wherein the scan transistors, the light emission transistors, and the driving transistor are P-type transistors.

22. The display device of claim 13, further comprising:
a reflective electrode disposed between the light emitting element and at least one of the scan transistors, the light emission transistors and the driving transistor,
wherein the light emitting element overlaps with the reflective electrode.

23. The display device of claim 13, wherein the scan signal includes:
a first scan signal and a second scan signal for turning on different scan transistors among the scan transistors, and
wherein a second dummy scan signal section and a second driving scan signal section of the second scan signal overlap with a first dummy scan signal section and a first driving scan signal section of the first scan signal, respectively.

24. The display device of claim 23, wherein the second dummy scan signal section and the second driving scan signal section occur before the first dummy scan signal section and the first driving scan signal section, respectively.

25. A display device, comprising:
a plurality of subpixels disposed on a substrate;
a scan line and a light emission line disposed on the substrate;
scan transistors disposed on the substrate and connected with the scan line for receiving a scan signal;
light emission transistors disposed on the substrate and connected with the light emission line for receiving a light emission signal;
a driving transistor disposed on a same plane as the scan transistors and the light emission transistors; and
a light emitting element disposed on at least one of the scan transistors, the light emission transistors and the driving transistor,
wherein a scan signal includes a dummy period having a dummy scan signal section for turning on the scan transistors and a period having a driving scan signal section for turning on the scan transistors,
wherein the light emission signal includes a coupling period having a dummy light emission signal section for turning on the light emission transistors, and
wherein the coupling period is between the dummy period having the dummy scan signal section and the period having the first driving scan signal section.

26. The display device of claim 25, wherein the first scan signal includes two or more of dummy periods, and
wherein the light emission signal includes two or more of coupling periods.

27. A method of controlling a pixel circuit, the method comprising:
supplying a first scan signal to a first transistor connected between a data line and a first capacitor, the first scan signal sequentially including a first dummy scan signal section and a first driving scan signal section having a first voltage level for turning on the first transistor; and
supplying a light emission signal to a first light emission transistor connected between the first capacitor and a reference voltage line and to a second light emission transistor connected between a drain electrode of a driving transistor and a low-potential voltage line,
wherein the first capacitor is connected between a gate electrode of a driving transistor and a first node,
wherein the driving transistor is connected to a light emitting element,
wherein a period having a signal section between a dummy period having the first dummy scan signal section and a period having the first driving scan signal section has a second voltage level different from the first voltage level, and
wherein the light emission signal includes a coupling period having a dummy light emission signal section for turning on the first light emission transistor and the second light emission transistor between the first dummy scan signal section and the first driving scan signal section.

* * * * *